(12) United States Patent
Seo et al.

(10) Patent No.: US 8,466,461 B2
(45) Date of Patent: Jun. 18, 2013

(54) RESISTIVE RANDOM ACCESS MEMORY AND METHOD OF MANUFACTURING THE SAME

(75) Inventors: Sun-ae Seo, Hwaseong-si (KR); Young-soo Park, Yongin-si (KR); Ran-ju Jung, Suwon-si (KR); Myoung-jae Lee, Suwon-si (KR); Dong-chul Kim, Suwon-si (KR); Seung-eon Ahn, Suwon-si (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 688 days.

(21) Appl. No.: 11/987,150

(22) Filed: Nov. 28, 2007

(65) Prior Publication Data

US 2008/0121864 A1 May 29, 2008

(30) Foreign Application Priority Data

Nov. 28, 2006 (KR) .................. 10-2006-0118560

(51) Int. Cl.
*H01L 29/10* (2006.01)
*H01L 29/12* (2006.01)

(52) U.S. Cl.
USPC ....... 257/43; 257/3; 257/4; 438/104; 365/148

(58) Field of Classification Search
USPC .................. 365/148; 257/2, 4; 438/104
See application file for complete search history.

(56) References Cited

U.S. PATENT DOCUMENTS

| | | | | |
|---|---|---|---|---|
| 3,679,947 A * | 7/1972 | Chakraverty et al. | ....... 338/22 R |
| 3,796,926 A | 3/1974 | Cole et al. | | |
| 4,003,075 A * | 1/1977 | Merrin | ............................... 257/2 |
| 4,118,727 A * | 10/1978 | Laplante | ........................... 257/1 |
| 5,804,473 A * | 9/1998 | Takizawa | ...................... 438/166 |
| 6,072,716 A * | 6/2000 | Jacobson et al. | ............... 365/163 |
| 6,534,326 B1 * | 3/2003 | Hsu et al. | ........................... 438/3 |
| 6,815,744 B1 | 11/2004 | Beck et al. | |
| 7,292,469 B2 * | 11/2007 | Lee et al. | ...................... 365/163 |
| 7,297,975 B2 * | 11/2007 | Ufert | ................................. 257/2 |
| 7,446,333 B2 * | 11/2008 | Kim et al. | ......................... 257/3 |

(Continued)

FOREIGN PATENT DOCUMENTS

| KR | 10-2001-0101805 | 11/2001 |
|---|---|---|
| KR | 10-2006-0023860 | 3/2006 |

(Continued)

OTHER PUBLICATIONS

Choi et al., Transition Metal Oxide & Chalcogenide Materials for ReRAM Applications, 2005, 13 pages.*

(Continued)

*Primary Examiner* — David Vu
*Assistant Examiner* — Earl Taylor
(74) *Attorney, Agent, or Firm* — Harness, Dickey & Pierce, P.L.C.

(57) ABSTRACT

Example embodiments relate to a resistive random access memory (RRAM) and a method of manufacturing the RRAM. A RRAM according to example embodiments may include a lower electrode, which may be formed on a lower structure (e.g., substrate). A resistive layer may be formed on the lower electrode, wherein the resistive layer may include a transition metal dopant. An upper electrode may be formed on the resistive layer. Accordingly, the transition metal dopant may form a filament in the resistive layer that operates as a current path.

11 Claims, 5 Drawing Sheets

U.S. PATENT DOCUMENTS

| | | | |
|---|---|---|---|
| 7,608,849 B2 * | 10/2009 | Ino et al. | 257/4 |
| 7,629,274 B2 * | 12/2009 | Lee et al. | 438/798 |
| 7,659,566 B2 * | 2/2010 | Ahn et al. | 257/298 |
| 7,678,607 B2 * | 3/2010 | Chiang et al. | 438/104 |
| 2004/0159867 A1 | 8/2004 | Kinney et al. | |
| 2004/0180491 A1 * | 9/2004 | Arai et al. | 438/200 |
| 2004/0245557 A1 * | 12/2004 | Seo et al. | 257/298 |
| 2005/0045943 A1 * | 3/2005 | Lung et al. | 257/325 |
| 2006/0027893 A1 | 2/2006 | Meijer et al. | |
| 2006/0054950 A1 * | 3/2006 | Baek et al. | 257/295 |
| 2006/0108625 A1 * | 5/2006 | Lee et al. | 257/310 |
| 2006/0109704 A1 * | 5/2006 | Seo et al. | 365/148 |
| 2006/0152961 A1 * | 7/2006 | Kim et al. | 365/148 |
| 2006/0250836 A1 * | 11/2006 | Herner et al. | 365/148 |
| 2006/0250837 A1 * | 11/2006 | Herner et al. | 365/148 |
| 2007/0037351 A1 * | 2/2007 | Ahn et al. | 438/261 |
| 2007/0045692 A1 * | 3/2007 | Kim et al. | 257/295 |
| 2007/0090444 A1 * | 4/2007 | Park et al. | 257/314 |
| 2007/0114508 A1 * | 5/2007 | Herner et al. | 257/2 |
| 2007/0114509 A1 * | 5/2007 | Herner | 257/4 |
| 2007/0120124 A1 * | 5/2007 | Chen et al. | 257/43 |
| 2007/0145345 A1 * | 6/2007 | Ino et al. | 257/2 |
| 2007/0159869 A1 * | 7/2007 | Baek et al. | 365/148 |
| 2007/0236981 A1 * | 10/2007 | Herner | 365/148 |
| 2007/0267675 A1 * | 11/2007 | Cho et al. | 257/306 |
| 2008/0106925 A1 * | 5/2008 | Paz de Araujo et al. | 365/148 |
| 2008/0106926 A1 * | 5/2008 | Brubaker et al. | 365/148 |
| 2008/0106927 A1 * | 5/2008 | Celinska et al. | 365/148 |
| 2008/0191251 A1 * | 8/2008 | Ranjan et al. | 257/295 |
| 2008/0219039 A1 * | 9/2008 | Kumar et al. | 365/148 |
| 2009/0231083 A1 * | 9/2009 | Hosoi et al. | 338/20 |
| 2010/0237317 A1 * | 9/2010 | Tsunoda | 257/4 |

FOREIGN PATENT DOCUMENTS

| | | |
|---|---|---|
| KR | 10-2006-0040517 A | 5/2006 |
| KR | 10-2006-0083368 | 7/2006 |
| WO | WO 00/49659 | 8/2000 |

OTHER PUBLICATIONS

Fuschillo et al., Atomic implantation of Nb in amorphous Nb2O5 by rf sputtering, J. Vac. Sci. Technol., vol. 12, No. 1, Jan./Feb. 1975, pp. 52-55.*

Shima et al., Reproducible Resistance Switching in Ni/NiO/Ni Trilayer, Mater. Res. Soc. Symp. Proc., vol. 997, 2007, 5 pages.*

Seo et al., Conductivity switching characteristics and reset currents in NiO films, Applied Physics Letters, 86, 2005, 3 pages.*

Wu et al., Analysis of AC electrical properties of (Li and Ti)-doped NiO, Materials Science and Engineering, B99, 2003, pp. 294-297.*

Choi et al., Resistive switching mechanism of TiO2 thin films grown by atomic-layer deposition, Journal of Applied Physics, 98, 2005, 10 pages.*

Hamaguchi et al., Electric-field-induced resistance switching universally observed in transition-metal-oxide thin films, Applied Physics Letters, 88, 2006, 3 pages.*

Kim et al., Electrical observations of filamentary conductions for the resistive memory switching in NiO films, Applied Physics Letters, 88, 2006, 3 pages.*

Wu et al., Giant Dielectric Permittivity Observed in Li and Ti doped NiO, Physical Review Letters, vol. 89., No. 21, Nov. 2002, 4 pages.*

Park et al., Reproducible resistive switching in nonstoichiometric nickel oxide films grown by rf reactive sputtering for resistive random access memory applications, J. Vac. Sci. Tech., 23(5), Sep./Oct. 2005, 5 pages.*

Office Action dated Mar. 5, 2010 issued in corresponding Korean Application No. 10-2006-0118560 and English translation thereof.

N. Fuschillo, et al., "*Non-Linear Transport and Switching Properties of Transition Metal Oxides*", Proc. 6$^{th}$ Internl. Vacuum Congr., Japan J. Appl. Phys. Suppl. 2, Pt. 1., pp. 817-820 (1974).

Korean Office Action dated Nov. 19, 2007.

Office Action dated Jan. 22, 2010 issued in corresponding Chinese Application No. 200710196017.9 and English translation thereof.

\* cited by examiner

RESISTIVE RANDOM ACCESS MEMORY AND METHOD OF MANUFACTURING THE SAME

PRIORITY STATEMENT

This application claims priority under 35 U.S.C. §119 to Korean Patent Application No. 10-2006-0118560, filed on Nov. 28, 2006 in the Korean Intellectual Property Office (KIPO), the entire contents of which are incorporated herein by reference.

BACKGROUND

1. Technical Field

Example embodiments relate to a resistive random access memory (RRAM) and a method of manufacturing the RRAM.

2. Description of the Related Art

A semiconductor memory array structure may include a plurality of interconnected memory cells. For example, a unit memory cell of a dynamic random access memory (DRAM) may include a switch and a capacitor. A DRAM may have higher integration and faster operating speeds. However, when the power is turned off, all of the stored data may be erased from the DRAM.

On the other hand, a flash memory may be representative of a non-volatile memory capable of preserving stored data when the power is turned off (unlike a volatile memory) but may have lower integration and slower operating speeds than a DRAM. Examples of a non-volatile memory may include a magnetic RAM (MRAM), a ferroelectric RAM (FRAM), and a phase-change RAM (PRAM). A MRAM may store data using a change in the polarization direction of a tunnel junction. A FRAM may store data using the polarization characteristic of a ferroelectric. The MRAM and the FRAM may have higher integrations, faster operating speeds, and improved data retention characteristics and may be driven at a lower power. A PRAM may store data using a change in a resistance value depending on the phase change of a specific material and may include a resistor and a switch (transistor). However, where a conventional DRAM process is used to manufacture the PRAM, etching may be more difficult and may require a longer period of time. Thus, productivity may be lowered, and the unit cost of products may be increased. Consequently, market competitiveness may be decreased.

Figure 1A:
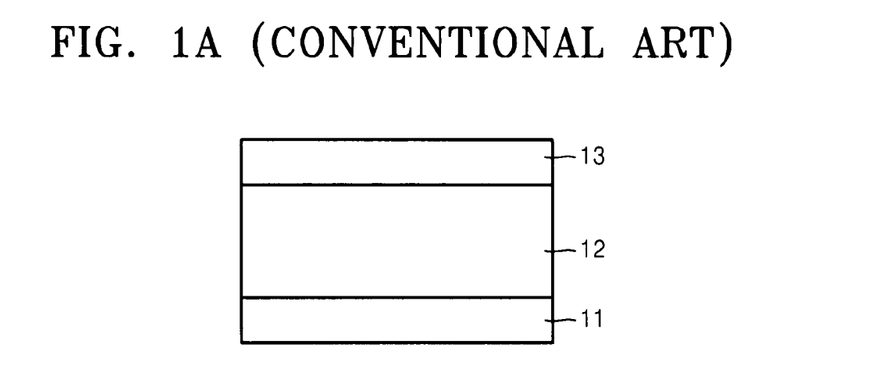
FIG. 1A is a cross-sectional view of a conventional resistive random access memory (RRAM) having a resistance transformation material.

A resistive RAM (RRAM) may store data using the variable resistance characteristic (e.g., a resistance value varying with voltage) of a transition metal oxide. FIG. 1A is a cross-sectional view of a conventional RRAM using a resistive transformation material. Referring to FIG. 1A, the conventional memory device may include a resistive layer 12 and an upper electrode 13 sequentially formed on a lower electrode 11. The resistive layer 12 may be formed of a transition metal oxide, and the lower and upper electrodes 11 and 13 may be formed of a conductive material, e.g., a metal or a metal oxide.

Figure 1B:
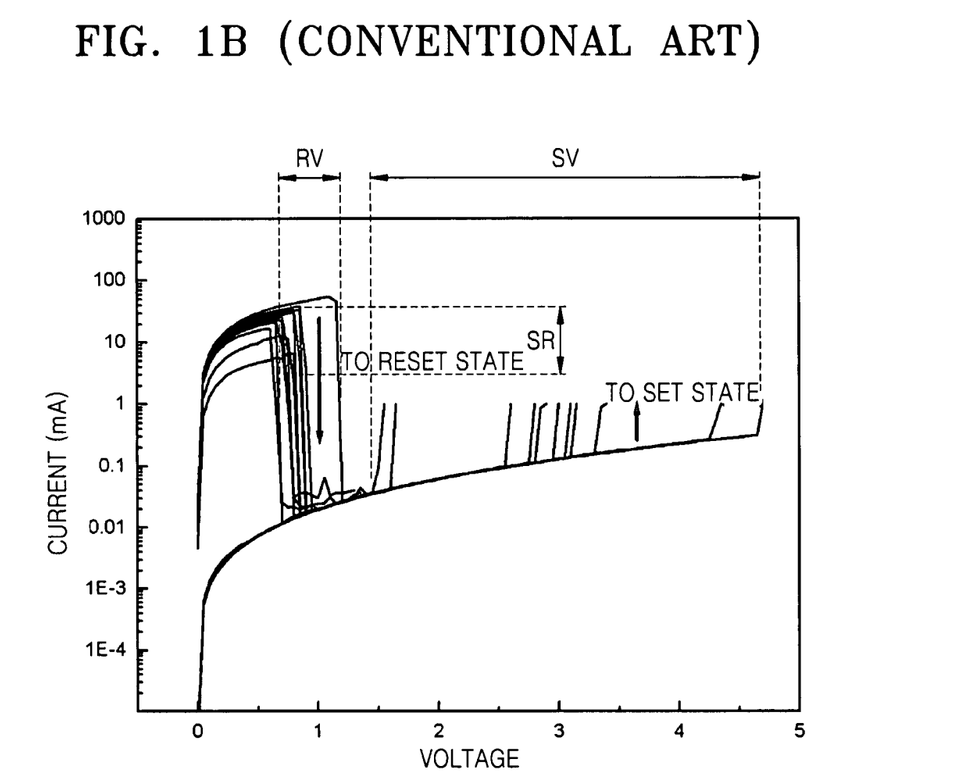
FIG. 1B is a graph illustrating variations of a current with respect to a voltage applied to the conventional RRAM of FIG. 1A.

FIG. 1B is a graph illustrating a relationship between a voltage applied through the lower and upper electrodes 11 and 13 and a current flowing in the resistive layer 12 of the conventional RRAM of FIG. 1A. The voltage may be gradually increased from 0 V to measure variations in the current flowing in the resistive layer 12. The current flowing in the resistive layer 12 may be gradually increased at an applied voltage between about 0 V and about 1 V. The current may decrease with an increase in resistance at a voltage of about 1 V and may increase again with a further increase in voltage. A higher resistance state may refer to a reset state, and a lower resistance state may refer to a set state. Variations in the intensity of a voltage at which the set state is changed into the reset state (e.g., a reset voltage RV) and variations in the intensity of a set resistance SR may be relatively large. Also, the set voltage SV at which the reset state is changed into the set state may have a relatively large variation.

Figure 2:
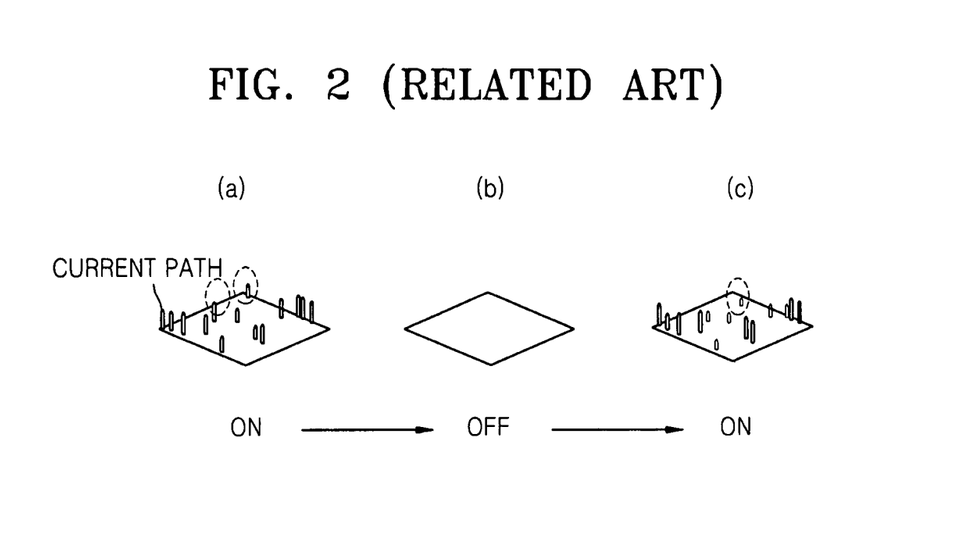
FIGS. 2A through 2C illustrate a current path formed in a resistive layer of the conventional RRAM of FIG. 1A upon application of a voltage.

FIGS. 2A through 2C illustrate a current path formed in the resistive layer 12 because of a voltage applied through the lower and upper electrodes 11 and 13 of the conventional RRAM. Referring to FIG. 2A, when a voltage is applied through the lower and upper electrodes 11 and 13, a current may flow in the resistive layer 12. Poles formed on a flat board of FIG. 2A may denote the current path. Referring to FIG. 2B, a current path may not be formed in an off state where voltage is not applied. Referring to FIG. 2C, when a voltage is applied through the lower and upper electrodes 11 and 13, a current may flow in the resistive layer 12. The current path of FIG. 2A may be different from the current path of FIG. 2C. For example, while the current may flow in a circular area of FIG. 2A, the current path does not appear to flow in a circular area of FIG. 2C. Thus, a current path formed in the resistive layer 12 may vary with the application of voltage. Accordingly, voltage and resistance variations, as shown in FIG. 1B, may occur.

Because the current path in the resistive layer 12 may not be uniform with the driving of the conventional RRAM (and thus the resistance level may be relatively unstable), the conventional RRAM may have larger voltage and resistance variations. Consequently, the set and reset voltages of the conventional RRAM may be relatively unstable, thus lowering reliability.

SUMMARY

Example embodiments provide a resistive random access memory (RRAM) having a structure capable of stabilizing a reset current and a set voltage using a resistance varying material and a method of manufacturing the RRAM. The RRAM may include a resistive layer having a metal dopant so as to form a filament as a current path in the resistive layer, thus stabilizing voltage and resistance variations.

A RRAM according to example embodiments may include a lower electrode; a resistive layer on the lower electrode, wherein the resistive layer may include a transition metal dopant; and/or an upper electrode on the resistive layer. The lower and upper electrodes may be formed of a metal or a metal oxide, wherein the metal may include at least one element selected from the group consisting of Al, Hf, Zr, Zn, W, Co, Au, Pt, Ru, Ir, and Ti. The resistive layer may be formed of a transition metal oxide, wherein the transition metal oxide may include at least one compound selected from the group consisting of NiO, $TiO_2$, HfO, ZrO, ZnO, $WO_3$, CoO, CuO, or $Nb_2O_5$. The transition metal dopant may include at least one element selected from the group consisting of Ni, Ti, Hf, Zr, Zn, Cu, W, Co, and Nb. For example, the resistive layer may be formed of NiO and the transition metal dopant may be Ni. Accordingly, the transition metal dopant may be concentrated in a grain boundary in the resistive layer so as to form a filament that may function as a current path.

A method of manufacturing a RRAM according to example embodiments may include forming a lower electrode; forming a resistive layer on the lower electrode; doping the resistive layer with a transition metal using an implantation process; and/or forming an upper electrode on the resistive layer. The oxygen partial pressure may be adjusted during the formation of the resistive layer. For example, the resistive layer may be formed of NiO at an oxygen partial pressure of about 25% or more, and the transition metal dopant may be Ni.

BRIEF DESCRIPTION OF THE DRAWINGS

The features and advantages of example embodiments may become more apparent upon consideration of the attached drawings, in which.

DETAILED DESCRIPTION OF EXAMPLE EMBODIMENTS

A resistive random access memory (RRAM) and a method of manufacturing the RRAM according to example embodiments will now be described with reference to the attached drawings. In the drawings, the thicknesses of layers and regions may have been exaggerated for clarity.

It will be understood that when an element or layer is referred to as being "on", "connected to", "coupled to", or "covering" another element or layer, it may be directly on, connected to, coupled to, or covering the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, e.g., "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Figure 3A:
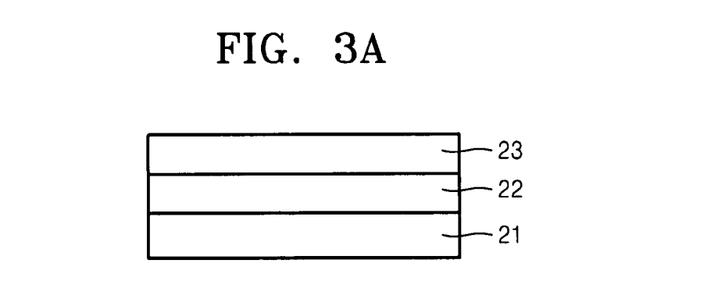
FIG. 3A is a cross-sectional view of a RRAM according to example embodiments.

FIG. 3A is a cross-sectional view of a RRAM according to example embodiments. Referring to FIG. 3A, a resistive layer 22 having a dopant may be formed on a lower electrode 21, and an upper electrode 23 may be formed on the resistive layer 22. Materials for forming the lower and upper electrodes 21 and 23 and the resistive layer 22 will now be described. The lower and upper electrodes 21 and 23 may be formed of a suitable electrode material used in semiconductor devices, e.g., Al, Hf, Zr, Zn, W, Co, Au, Pt, Ru, Ir, Ti, and/or a conductive metal oxide. The resistive layer 22 may be formed of a suitable material for an RRAM, e.g., transition metal oxide. For example, the resistive layer 22 may be formed of NiO, $TiO_2$, HfO, ZrO, ZnO, $WO_3$, CoO, CuO, $Nb_2O_5$, or a combination thereof. The resistive layer 22 may include a transition metal oxide and a dopant which may be implanted using an implantation process. The dopant implanted into the resistive layer 22 may be a metallic material, e.g., Ni, Ti, Hf, Zr, Zn, Cu, W, Co, and/or Nb.

Figure 3B:
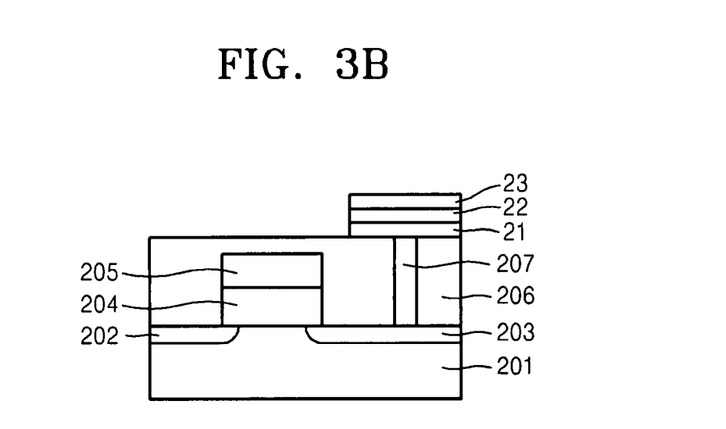
FIG. 3B is a cross-sectional view of the RRAM of FIG. 3A formed on a transistor structure.

The RRAM may be driven in a 1S (Switch)-1R (Resistance) pattern connected to a switch structure, e.g., a transistor or a diode. FIG. 3B is a cross-sectional view of a 1T (Transistor)-1R (Resistance) structure in which the RRAM of FIG. 3A is connected to a transistor. Referring to FIG. 3B, a gate structure may be formed on a substrate 201 so as to contact the first and second dopant areas 202 and 203. The gate structure may include a gate insulating layer 204 and a gate electrode layer 205. An interlayer insulating layer 206 may be formed on the substrate 201 and the gate structure, and a contact plug 207 may be formed to penetrate the interlayer insulating layer 206 on the first or second dopant area 202 or 203. The RRAM of FIG. 3A may be formed on the contact plug 207. Alternatively, as mentioned above, the RRAM of FIG. 3A may be connected to a diode including p-type and n-type semiconductor layers instead of a transistor.

Figure 4A:
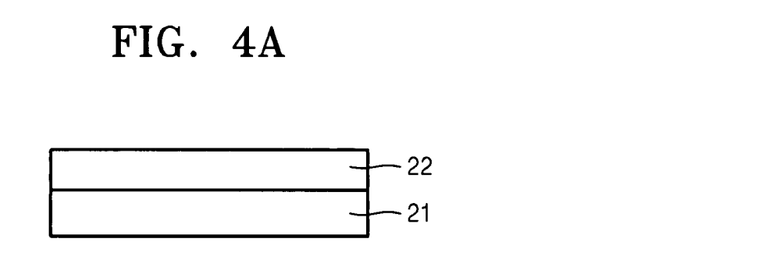
FIGS. 4A through 4C are cross-sectional views illustrating a method of manufacturing an RRAM according to example embodiments.

A method of manufacturing a RRAM according to example embodiments will now be described. The RRAM may be formed using sputtering, atomic layer deposition (ALD), or chemical vapor deposition. Referring to FIG. 4A, a lower electrode 21 may be formed on a lower structure (not shown), e.g., a substrate. The lower electrode 21 may be formed of a conductive material, e.g., metal or metal oxide. For example, the lower electrode 21 may be formed of Al, Hf, Zr, Zn, W, Co, Au, Pt, Ru, Ir, and/or Ti. A resistive layer 22 may be formed on the lower electrode 21. The resistive layer 22 may be formed of transition metal oxide, e.g., NiO, $TiO_2$, HfO, ZrO, ZnO, $WO_3$, CoO, CuO, and/or $Nb_2O_5$.

Figure 4B:
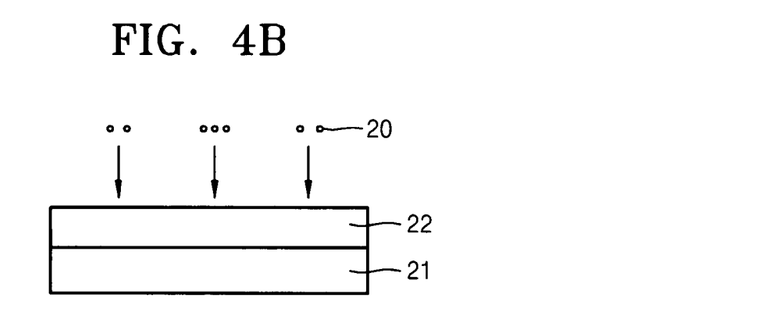
Figure 5:
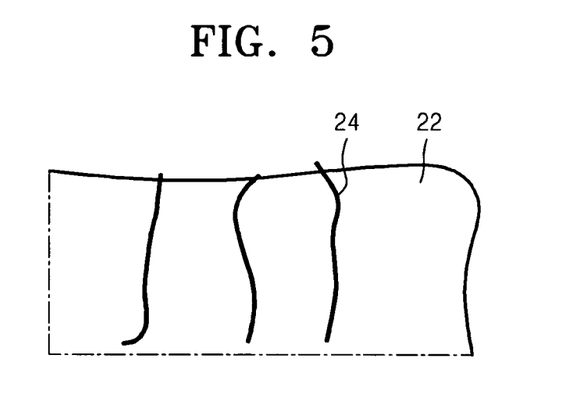
FIG. 5 illustrates a metal diffusion path formed in a resistive layer during an implantation process of a method of manufacturing an RRAM according to example embodiments.

Referring to FIG. 4B, a dopant 20 may be implanted into the resistive layer 22 using an implantation process. The dopant 20 may be metal, e.g., transition metal. For example, the dopant 20 may include Ni, Ti, Hf, Zr, Zn, Cu, W, Co, and/or Nb. When the dopant 20 is implanted into the resistive layer 22, the dopant 20 may diffuse into an empty area, e.g., a grain boundary of a material constituting the resistive layer or a defective area. The diffused dopant 20 may form a filament so as to operate as a current path 24 (e.g., a current transfer path) in the resistive layer 22, as shown in FIG. 5.

Figure 6:
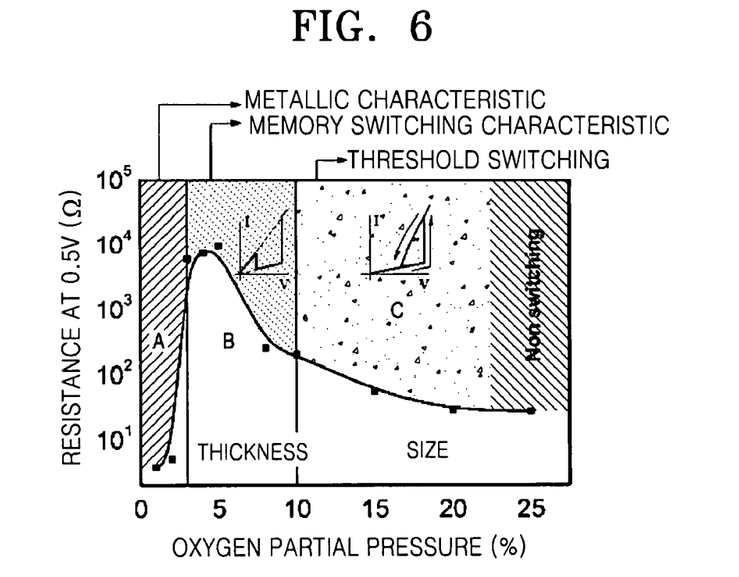
FIG. 6 is a graph illustrating a resistance characteristic with respect to variations of the oxygen partial pressure of Ni oxide.

Example embodiments having a resistive layer 22 formed of NiO will now be described. When the oxygen partial pressure of a process chamber is adjusted, a transition metal oxide may exhibit the characteristics shown in FIG. 6. Atmospheric gas and oxygen may be used to form the resistive layer 22. When the partial pressure of oxygen is relatively low (area A), the transition metal oxide may have a metallic characteristic similar to Ni. When the partial pressure of oxygen is increased (area B), the resistance of the transition metal oxide may also increase. Thus, the transition metal oxide may have a memory switching characteristic. Additionally, when the partial pressure of oxygen is further increased (area C), the resistance of the transition metal oxide may decrease. Thus, the transition metal oxide may also have a threshold switching characteristic. For example, the switching characteristic may disappear when the oxygen partial pressure is about 25%. When the resistive layer 22 is formed of Ni oxide, the oxygen partial pressure may be adjusted to be greater than that of area C, and Ni may be implanted into the resistive layer 22 formed of Ni oxide using an implantation process. Consequently, interstitially implanting a Ni dopant into the Ni oxide may be more difficult because of its dense structure. Thus, the Ni dopant may shift into an empty position (e.g., a grain boundary) so as to form a filament which may operate as a current path.

Figure 4C:
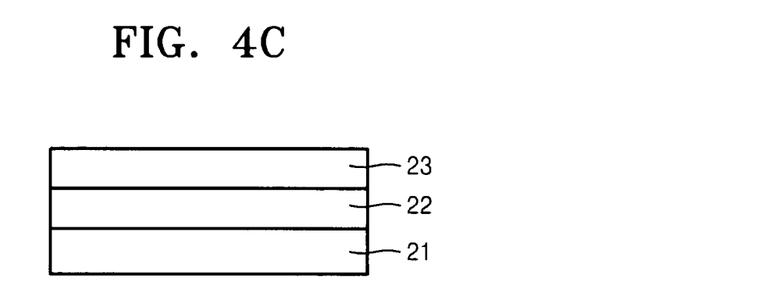

Referring to FIG. 4C, an upper electrode 23 may be formed on the resistive layer 22. The upper electrode 23 may be formed of the same material as the lower electrode 21 (e.g., metal or conductive metal oxide). For example, the upper electrode 23 may be formed of Al, Hf, Zr, Zn, W, Co, Au, Pt, Ru, Ir, and/or Ti. After manufacturing a conventional RRAM, a forming process may be performed to apply a higher voltage than an operating voltage to the conventional RRAM. Thus, impact may be applied to the conventional RRAM, and the operating voltage may be increased. In contrast, the RRAM according to example embodiments may operate without requiring a forming process.

Figure 7A:
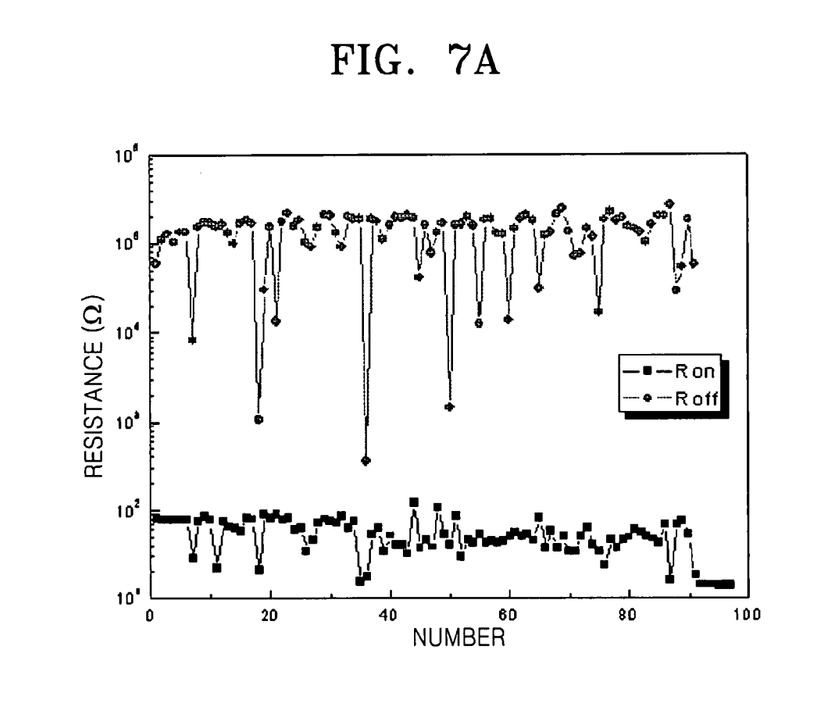
FIGS. 7A and 7B are graphs comparing the resistance variation of a conventional RRAM with the resistance variation of a RRAM according to example embodiments.
Figure 7B:
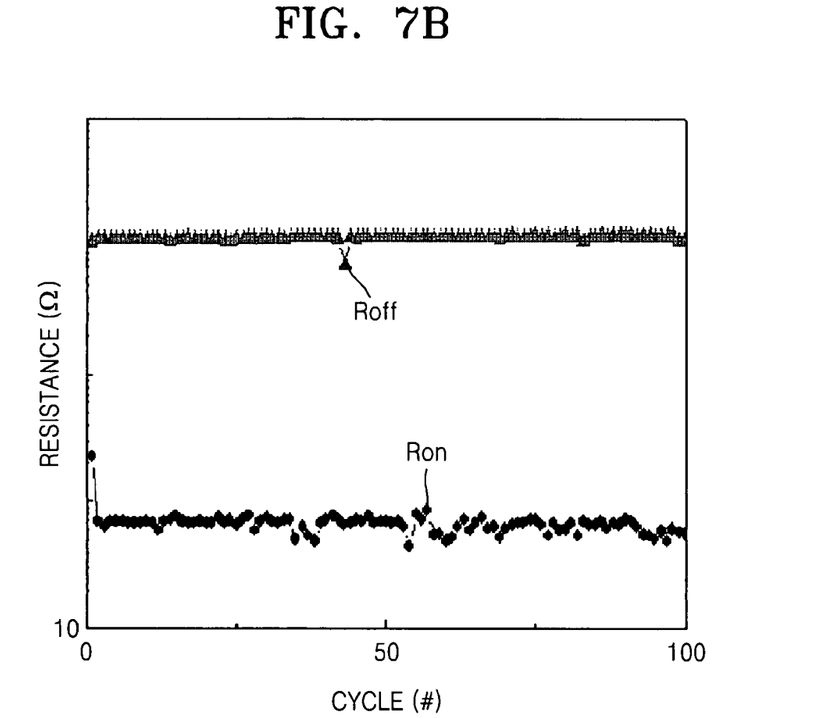

FIGS. 7A and 7B are graphs illustrating variations in the resistance value of a resistive layer according to a conventional RRAM compared with variations in the resistance value of a resistive layer of an RRAM according to example embodiments. Variations in resistance may be measured by the application of a current through the upper and lower electrodes. The horizontal axis may denote the number of times the resistance of the resistive layer is measured, and the vertical axis may denote the resistance value. FIG. 7A is a graph illustrating variations in the resistance value of a conventional RRAM, and FIG. 7B is a graph illustrating variations in the resistance value of a RRAM according to example embodiments. Referring to FIG. 7A, the resistance value may have relatively large variations in the on and off states. Referring to FIG. 7B, the resistance value may be relatively constant in the on and off states. Thus, resistance variation may be relatively low in a RRAM according to example embodiments.

Figure 8:
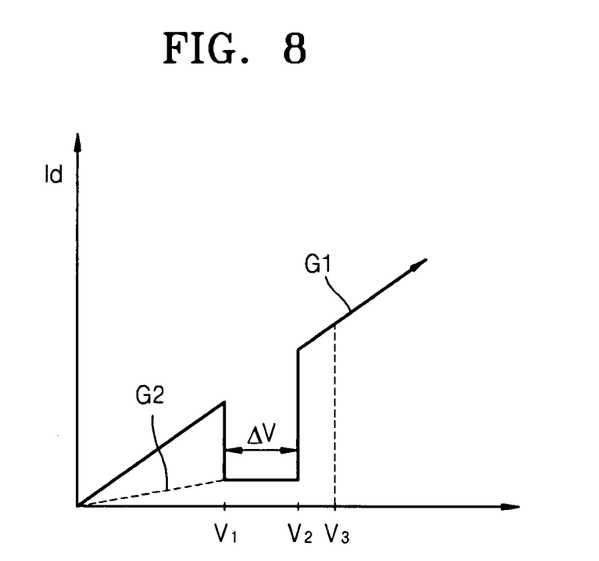
FIG. 8 is a graph illustrating a simplified electrical characteristic of an RRAM having a resistance varying material according to example embodiments.

FIG. 8 is a graph illustrating a simplified operation characteristic of a RRAM according to example embodiments. The horizontal axis may denote an applied voltage, and the vertical axis may denote variations of a current with respect to the applied voltage. When a voltage applied through the lower and upper electrodes is increased from 0 V, the current may also be increased in proportion to the voltage, as shown by $G_1$. However, when a voltage greater than a voltage $V_1$ is applied, the resistance of the resistive layer may increase, thus decreasing the current. When a voltage between voltages $V_1$ and $V_2$ is applied, the current flowing in the resistive layer may vary as shown by $G_2$. When a voltage greater the voltage $V_2$ ($V_2>V_1$) is applied, the resistance may decrease. Thus, the current may increase as shown by $G_1$.

Applying a voltage greater than the voltage $V_1$ may affect the electrical characteristics (e.g., current levels) of the RRAM when a voltage smaller than the voltage $V_1$ is subsequently applied. This electrical characteristic will now be described in further detail. For example, when a voltage between the voltages $V_1$ and $V_2$ is applied to the RRAM followed by a voltage smaller than the voltage $V_1$, the resulting current may be as shown by $G_2$. On the other hand, when a voltage $V_3$ (which is greater than the voltage $V_2$) is applied to the RRAM followed by a voltage smaller than the voltage $V_1$, the resulting current may be as shown by $G_1$. Thus, the intensity of the voltage applied in the range greater than the voltage $V_1$ (e.g., between the voltages $V_1$ and $V_2$ or greater than the voltage $V_2$) may affect the electrical characteristic of the RRAM.

Accordingly, a transition metal oxide may be used in a RRAM to provide a multilayer film having a resistance gradient for a non-volatile memory device. For example, if the state of the RRAM supplied with the voltage between the voltages $V_1$ and $V_2$ is designated as "0," then the state of the RRAM supplied with the voltage greater than the voltage $V_2$ may be designated as "1" to record data. When data is to be reproduced, a voltage smaller than the voltage $V_1$ may be applied to the RRAM to measure the drain current $I_d$ so as to check whether stored data is in a state of "0" or "1." The states "1" and "0" may be selectively designated. A set voltage $V_2$, a reset voltage $V_1$, and a resistance may be constant according to the number of operations of an RRAM having an implant. Thus, the RRAM may have a more stable characteristic.

As described above, in a RRAM according to example embodiments and a method of manufacturing the same, the current path of the RRAM may be maintained relatively uniformly. Thus, variations in the resistance of a resistive layer may be reduced. Consequently, the RRAM may have a more stable characteristic. Also, the RRAM may be manufactured without a forming process. Thus, the impact applied to the RRAM may be relieved, and the operating voltage may be lowered. Additionally, information may be stored and reproduced using a simpler method. Accordingly, the RRAM may have a faster operation.

While example embodiments have been disclosed herein, it should be understood that other variations may be possible. Such variations are not to be regarded as a departure from the spirit and scope of example embodiments of the present disclosure, and all such modifications as would be obvious to one skilled in the art are intended to be included within the scope of the following claims.

What is claimed is:

1. A resistive random access memory comprising:
   a lower electrode;
   a resistive layer on the lower electrode, the resistive layer having an implanted transition metal dopant; and
   an upper electrode on the resistive layer,
   wherein at least one of the lower and upper electrodes is formed of a metal, the transition metal dopant includes at least one element selected from the group consisting of Ni, Ti, Hf, Zr, Zn, Cu, W, Co, and Nb, the resistive layer is formed at an oxygen partial pressure that increases a density of the resistive layer such that more of the implanted transition metal dopant is present in a grain boundary of the resistive layer than is present interstitially within the resistive layer, and the implanted transition metal dopant is positioned as a current path, the current path being a structure composed of a quantity of the implanted transition metal dopant, the resistive layer having a non-switching characteristic extending from a lower interface with the lower electrode to an upper interface with the upper electrode.

2. The resistive random access memory of claim 1, wherein the lower electrode is formed of a metal or a metal oxide.

3. The resistive random access memory of claim 2, wherein the metal includes at least one element selected from the group consisting of Al, Hf, Zr, Zn, W, Co, Au, Pt, Ru, Ir, and Ti.

4. The resistive random access memory of claim 1, wherein the resistive layer is formed of a transition metal oxide.

5. The resistive random access memory of claim 4, wherein the transition metal oxide includes at least one compound selected from the group consisting of NiO, $TiO_2$, HfO, ZrO, ZnO, $WO_3$, CoO, CuO, and $Nb_2O_5$.

6. The resistive random access memory of claim 1, wherein the transition metal dopant is concentrated in a grain boundary in the resistive layer to form a filament as the current path.

7. The resistive random access memory of claim 1, wherein
   the resistive layer is formed of NiO, and
   the transition metal dopant is Ni.

8. The resistive random access memory of claim 1, wherein the upper electrode is formed of a metal or a metal oxide.

9. The resistive random access memory of claim 8, wherein the metal includes at least one element selected from the group consisting of Al, Hf, Zr, Zn, W, Co, Au, Pt, Ru, Ir, and Ti.

10. The resistive random access memory of claim 1, wherein the oxygen partial pressure exceeds a threshold level such that the resistive layer lacks a threshold switching characteristic.

11. The resistive random access memory of claim 1, wherein the oxygen partial pressure is about 25% or more.

* * * * *